(12) United States Patent
Abdelnaby et al.

(10) Patent No.: US 9,412,706 B1
(45) Date of Patent: Aug. 9, 2016

(54) ENGINEERED CARRIER WAFERS

(71) Applicant: Micron Technology, Inc., Boise, ID (US)

(72) Inventors: Ahmed H. Abdelnaby, Boise, ID (US); Sony Varghese, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/609,272

(22) Filed: Jan. 29, 2015

(51) Int. Cl.
*H01L 21/304* (2006.01)
*H01L 21/56* (2006.01)
*H01L 21/683* (2006.01)
*H01L 23/00* (2006.01)
*H01L 21/48* (2006.01)

(52) U.S. Cl.
CPC ............ *H01L 23/562* (2013.01); *H01L 21/304* (2013.01); *H01L 21/481* (2013.01); *H01L 21/6835* (2013.01); *H01L 21/568* (2013.01); *H01L 2224/80* (2013.01)

(58) Field of Classification Search
CPC .............. H01L 2224/80; H01L 21/304; H01L 21/6835; H01L 21/568
USPC ................................... 438/457, 479
See application file for complete search history.

(56) References Cited

U.S. PATENT DOCUMENTS

| 5,071,785 A | * | 12/1991 | Nakazato | ............ | H01L 21/2007 148/DIG. 12 |
| 2003/0197176 A1 | * | 10/2003 | Spallas | ............... | B81C 1/00119 257/58 |
| 2006/0141742 A1 | * | 6/2006 | Fournel | ................ | H01L 21/187 438/455 |

\* cited by examiner

*Primary Examiner* — Karen Kusumakar
(74) *Attorney, Agent, or Firm* — Dorsey & Whitney LLP

(57) ABSTRACT

Apparatuses and methods for reducing the warp of semiconductor wafer stacks during manufacturing are disclosed. An engineered carrier wafer is disclosed. The engineered carrier wafer may be pre-stressed such that it exhibits a warp. The warp may be configured to counteract a warp of a device wafer included in the wafer stack. The overall warp of the wafer stack may be reduced.

24 Claims, 7 Drawing Sheets

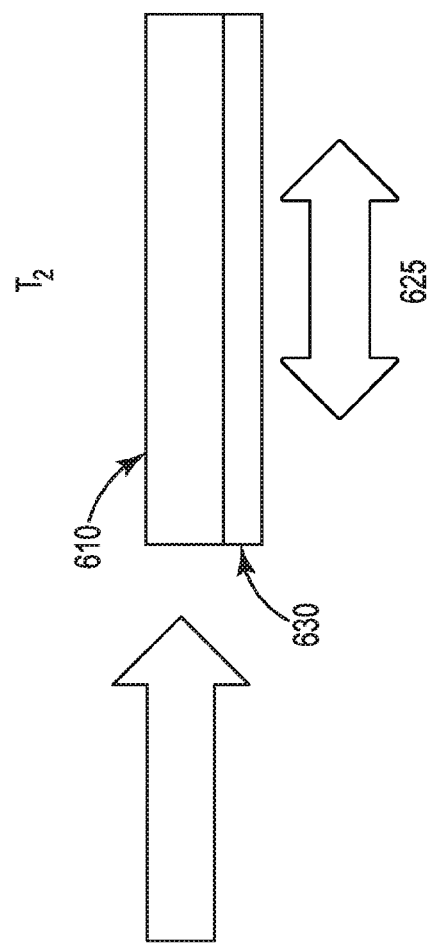
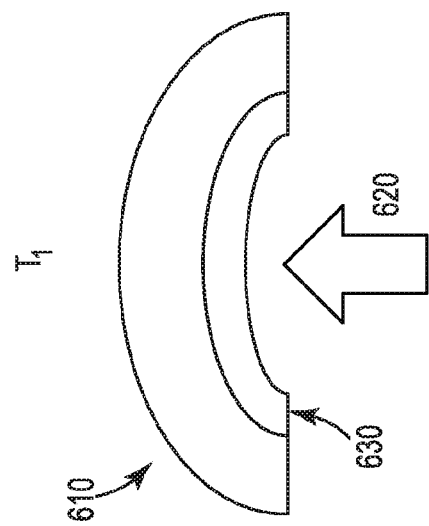
Figure 6

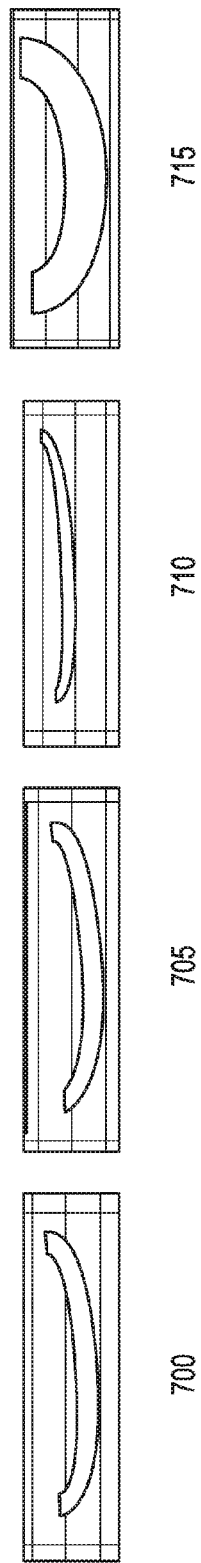

ENGINEERED CARRIER WAFERS

BACKGROUND

Semiconductor device wafers may be temporarily coupled to carrier wafers during semiconductor processing. The carrier wafers may provide support for the device wafers during one or more processes during manufacturing. Carrier wafers may reduce breakage of fragile device wafers and/or allow non-standard sized device wafers to be processed by a machine that performs one or more processes. Certain processes may apply stress to the device wafer. The device wafer may become warped in response to the applied stress. The warping of the device wafer may translate to the carrier wafer, causing the carrier wafer to warp as well. In some instances, the warping of the device wafer may be severe enough that one or more machines may not be able to perform a process on the device wafer. Warping of the device and carrier wafers may also degrade the outcome of processes that are performed on the device wafer.

BRIEF DESCRIPTION OF THE DRAWINGS

FIG. 6 is a schematic illustration of an engineered carrier wafer according to an embodiment of the disclosure.

FIG. 7 is a schematic illustration of wafer stacks according to an embodiment of the disclosure.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known wafer components, machines, and semiconductor processes have not been described or shown in detail in order to avoid unnecessarily obscuring the invention.

Figure 1:
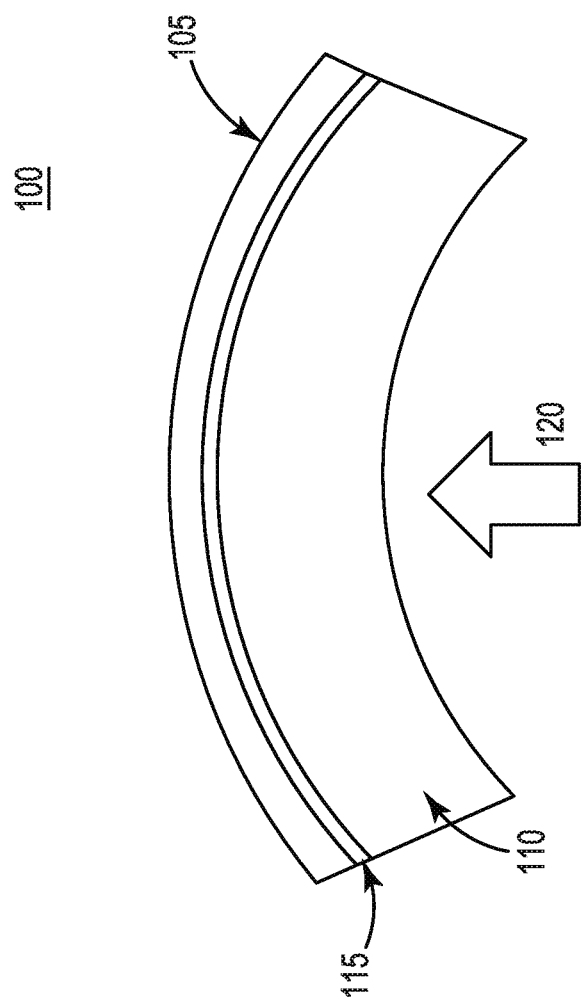
FIG. 1 is a schematic illustration of an example wafer stack.

FIG. 1 illustrates an example wafer stack 100. The wafer stack 100 may include a device wafer 105 reversibly coupled to a carrier wafer 110. That is, the device wafer 105 may be coupled to the carrier wafer 110 then removed from the carrier wafer 110. The device wafer 105 may be coupled to the carrier wafer 110 by an adhesive 115. The adhesive 115 may be removable, which may allow the device wafer 105 to be removed from the carrier wafer 110. In the example illustrated in FIG. 1, the device wafer 105 may have been exposed to a process that applied a stress to the device wafer 105, causing the wafer stack 100 to warp in the direction indicated by arrow 120. By warp, it is meant that a planar surface of a wafer and/or wafer stack is deformed for example, in a concave, convex, or combined concave and convex manner. In other words, the surface of a wafer and/or wafer stack may deviate from a generally planar reference plane, and may exhibit a bow, curvature, twist, and like. Performing a process on a wafer may also be referred to as processing. Examples of processes may include polishing, etching, deposition, implantation, and/or another process. The warped wafer stack 100 may be warped to such a degree that it may not be able to be properly coupled into a machine for processing. In some instances, while the warped wafer stack 100 may be capable of being coupled into a machine, processing may produce inferior results due to the warping of the wafer stack 100. Automated testing equipment may provide a false defect signal because the warping may cause at least a portion of the wafer stack 100 to be out of range and/or focus.

Figure 2:
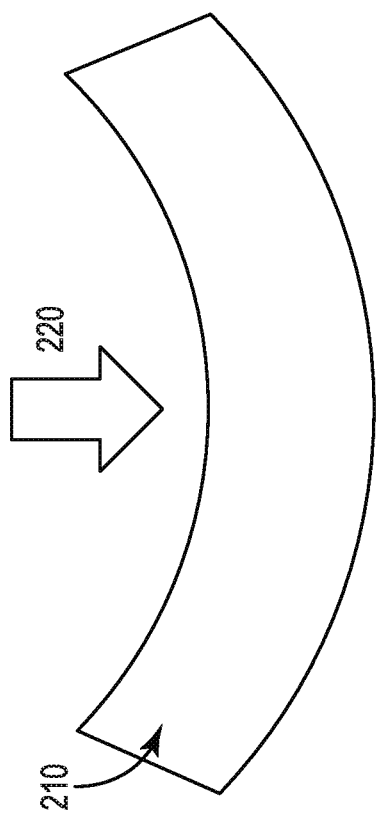
FIG. 2 is a schematic illustration of an engineered carrier wafer according to an embodiment of the disclosure.

FIG. 2 illustrates an engineered carrier wafer 210 according to an embodiment of the disclosure. As will be described in greater detail below, the engineered carrier wafer 210 may be engineered to be pre-stressed such that it at least partially counters warping of a device wafer attached thereto to reduce the warp of a wafer stack. Pre-stress refers to a stress applied to an engineered carrier wafer before a device wafer is coupled and/or before a wafer stack including an engineered carrier wafer is processed. In some embodiments, the engineered carrier wafer 210 may be silicon. However, other materials may also be used, including, but not limited to, quartz, glass, sapphire, and/or silicon carbide. In some embodiments, the engineered carrier wafer 210 may be a composite. In FIG. 2, the engineered carrier wafer 210 has been pre-stressed such that the engineered carrier wafer 210 is warped in a direction indicated by arrow 220. The direction and magnitude of the warp may be chosen to counteract the warp of a device wafer (not shown in FIG. 2). The engineered carrier wafer may be pre-stressed in a variety of manners. For example, the engineered carrier wafer 210 may be subjected to one or more semiconductor processes. Other examples includes physically deforming the engineered carrier wafer 210, such as scoring, scratching, cutting, etc. the engineered carrier wafer 210.

Figure 3:
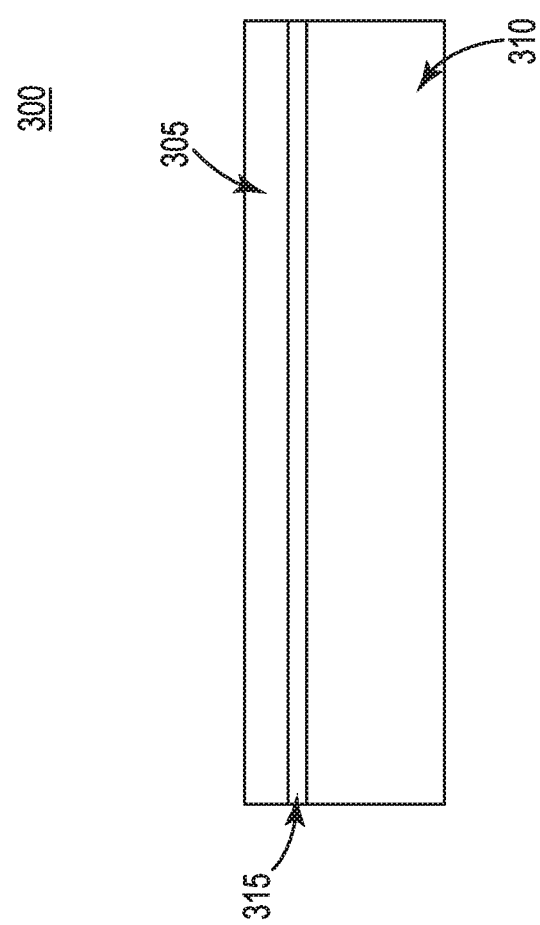
FIG. 3 is a schematic illustration of an example wafer stack according to an embodiment of the disclosure.

FIG. 3 illustrates a wafer stack 300 according to an embodiment of the disclosure. The wafer stack 300 may include a device wafer 305 reversibly coupled to an engineered carrier wafer 310 that may be pre-stressed. The device wafer 305 may be coupled to the engineered carrier wafer 310 by an adhesive 315. The adhesive 315 may be removable. As shown in FIG. 3, the warp of the wafer stack 300 may be less than the warp of wafer stack 100. The reduction in warp of the wafer stack may be due in part to the pre-stress applied to the engineered carrier wafer 310. The wafer stack 300 may be more easily coupled to machines for processing and/or allow for more accurate automated testing of the device wafer 305.

Different processing of a device wafer may cause different magnitudes and directions of warping. Examples of processes that may induce stress that may warp a device wafer include, but are not limited to, polishing, grinding, layer deposition, implantation, and doping. A carrier wafer may be pre-stressed to produce an engineered carrier wafer by one or more processes. The processes may be performed to a first surface and/or a second surface opposite the first surface. For example, processes may be performed to the back and/or face of the carrier wafer. The face of the carrier wafer may be coupled to a device wafer. In some embodiments, an engineered carrier wafer may be engineered to compensate for the device wafer warping to reduce the warp of the wafer stack over multiple processes. In some embodiments, multiple engineered carrier wafers may be engineered to compensate for each process performed on the device wafer. For example, the device wafer may be removed from a first engineered carrier wafer after a first process and then applied to a second engineered carrier wafer before a second process is performed.

In some embodiments, an engineered carrier wafer may also have one or more processes performed on it while it is coupled to a device wafer. The processes performed on the engineered carrier wafer may be selected to compensate for device wafer warping due to different processes performed on the device wafer to reduce warping of the wafer stack. For example, a device wafer coupled to a carrier wafer according to an embodiment of the disclosure may undergo a first process after which the engineered carrier wafer may undergo a separate process before a second process is performed on the device wafer. The separate process performed on the engineered carrier wafer may configure the engineered carrier wafer such that it is pre-stressed to compensate for warping of the wafer stack induced by the second process performed on the device wafer.

Figure 4:
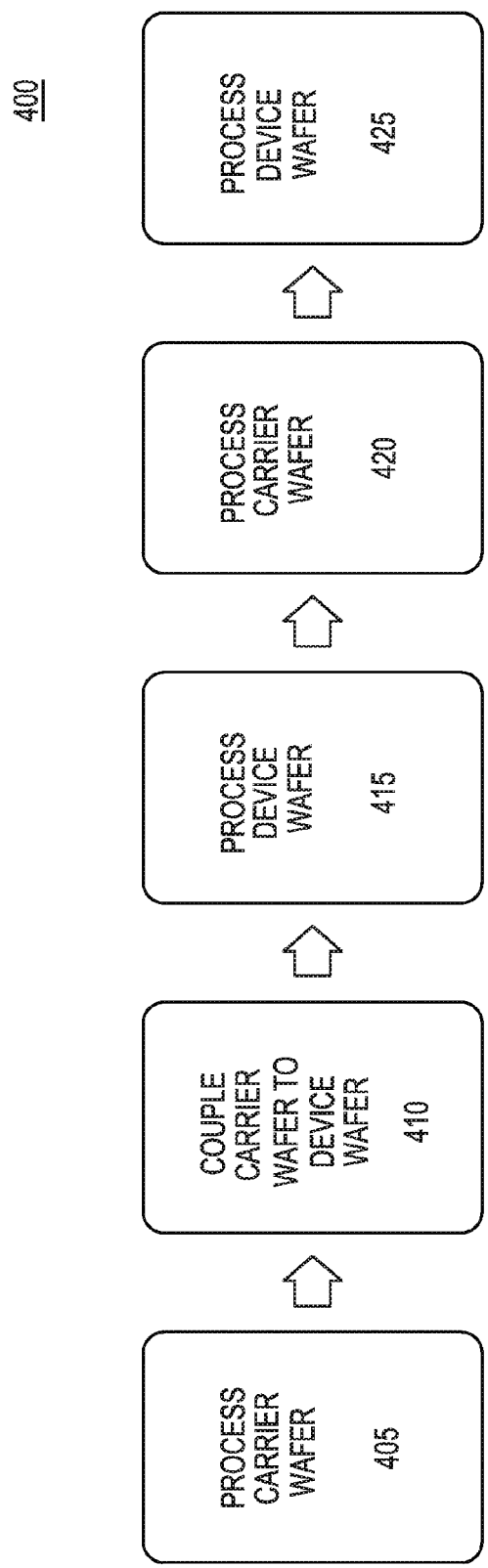
FIG. 4 is a flow diagram of an example process according to an embodiment of the disclosure.

FIG. 4 illustrates an example method 400 according to an embodiment of the disclosure. First, at Step 405, a carrier wafer may be processed to produce an engineered carrier wafer exhibiting a desired warp. The carrier wafer may be processed to apply a stress on the carrier wafer that induces the warp. At Step 410, the engineered carrier wafer may be coupled to a device wafer. Alternatively, Step 410 may precede Step 405. That is, the carrier wafer may be coupled to the device wafer before a stress is induced in the carrier wafer to produce an engineered carrier wafer that exhibits a desired warp. After the engineered carrier wafer and device wafer are coupled to form a wafer stack, the device wafer may be processed at Step 415. The wafer stack may exhibit a different warp after the device wafer is processed. A second process may be performed on the engineered carrier wafer at Step 420. The device wafer may remain coupled to the carrier wafer during Step 420. The process may be performed to prepare the engineered carrier wafer to compensate for the warping of the device wafer in response to subsequent processing of the device wafer at Step 425 to reduce the warp of the wafer stack.

Figure 5:
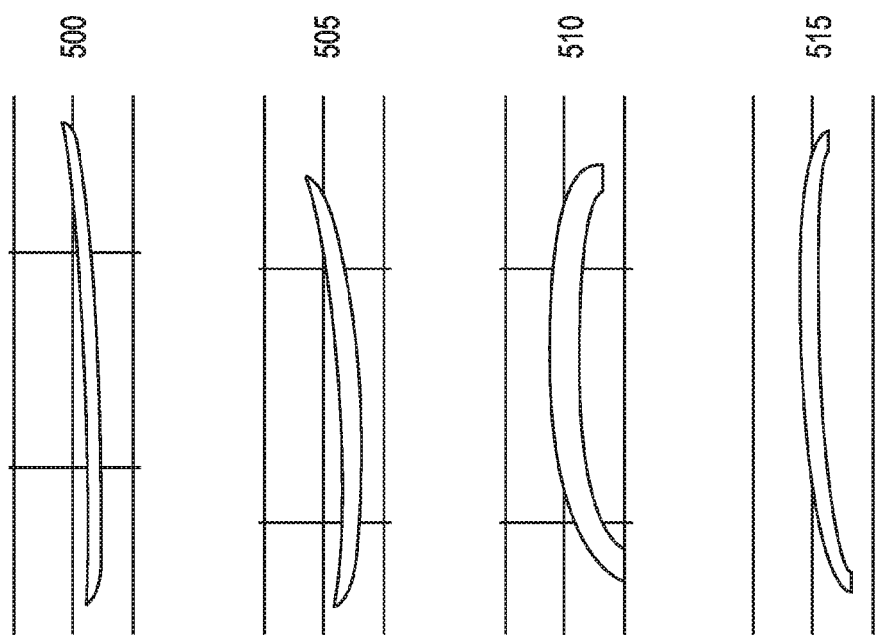
FIG. 5 is a schematic illustration of engineered carrier wafers according to an embodiment of the disclosure.

FIG. 5 illustrates a carrier wafer and engineered carrier wafers according to embodiments of the invention. A carrier wafer 500 may have an initial warp, for example, of 37 μm. That is, the difference between the highest and lowest points of elevation measured on a surface of the carrier wafer is 37 μm. The initial warp may be due to a pre-existing stress on the carrier wafer. The pre-existing stress may be introduced by the fabrication of the carrier wafer and/or properties of the materials included in the carrier wafer. An ultra-fine grinding process may be applied to the back surface of the carrier wafer 500. This may apply a stress to the carrier wafer 500, resulting in engineered carrier wafer 505. The warp of the engineered carrier wafer 505 may be greater than the original carrier wafer 500, for example the warp may be 83 μm. Alternatively, a fine grind may be applied to the face of the carrier wafer 500. This process may apply a stress to the carrier wafer 500, resulting in engineered carrier wafer 510. The warp of the engineered carrier wafer 510 may be greater than the original carrier wafer 500, for example the warp may be −188 μm. In this example, the warp value may be negative because the engineered carrier wafer 510 warps in the opposite direction as the engineered carrier wafer 505 relative to a reference plane. Two or more grinding processes may be applied to the same carrier wafer. For example, a fine grinding process may be applied to a first surface of the carrier wafer 500 and an ultra-fine grinding process may be applied to a second surface of the carrier wafer 500. The combination of processes may result in engineered carrier wafer 515. The warp of engineered carrier wafer 515 may be, for example, −86 μm. In some embodiments, multiple grinding processes may be applied to the surfaces of the carrier wafer 500. By applying a combination of processes, for example, grinding processes as illustrated in FIG. 5, the warping of the engineered carrier wafer may be fine-tuned to a desired warp. Other grinding processes may also be possible, for example, course grinding, patterned surface grinding, and grinding with a desired ratio of course-to-fine grinds.

In some embodiments, a carrier wafer may be pre-stressed by depositing one or more material on one or more surfaces of the carrier wafer to produce an engineered carrier wafer. Materials may include metals, oxides, nitrides, polysilicon, and polymers, for example. Other materials may also be used. The deposition may be a uniform deposition or a patterned deposition. In some embodiments, one deposited layer of material may be uniform and a subsequent deposited layer may be patterned, or vice versa. In some embodiments, an engineered carrier wafer may be pre-stressed by ion implantation and/or doping. In some embodiments, the engineered carrier wafer may be pre-stressed by thermally treating the engineered carrier wafer. In some embodiments, the adhesive used to couple the engineered carrier wafer to the device wafer may be configured to apply a stress to the engineered carrier wafer. One or more of the processes described above may be used in combination to achieve the desired pre-stress warp of the engineered carrier wafer.

Processing the device wafer may expose the device wafer to a range of temperatures. The warp of the device wafer may be temperature dependent. In some embodiments, an engineered carrier wafer may be engineered to also have a temperature dependent warp. In some embodiments, a metal layer may be applied to an engineered carrier wafer to apply a stress. The stress applied by the metal layer may be temperature dependent. The temperature dependence of the stress applied to the engineered carrier wafer by the metal layer may allow for the carrier wafer to compensate for the changing warp of a device wafer as it is exposed to a range of temperatures to reduce the warp of the wafer stack. The degree of warp and the temperature dependence of the warp of the engineered carrier wafer may be affected by the thickness of the layer and the type of material deposited. The pattern in which the material is deposited may also impact the magnitude of warp and the temperature dependence. In some embodiments, more than one material is deposited on the engineered carrier wafer to achieve a desired warp and temperature dependence. The temperature dependence of the warp may be linear or non-linear.

FIG. 6 illustrates an example engineered carrier wafer 610 according to an embodiment of the disclosure. The engineered carrier wafer 610 may have a layer 630 deposited on a back surface. The layer 630 may be implemented, for example, with a metal, a nitride, a passivation material, or a combination of materials. At a first temperature $T_1$, the engineered carrier wafer 610 may exhibit a warp in the direction of arrow 625. At a second temperature, $T_2$, the engineered carrier wafer 610 may exhibit little or no warp as shown by arrow 625. The difference in warp between $T_1$ and $T_2$ may be due, at least in part, to the behavior of the material of layer 630 at different temperatures. In some embodiments, $T_1$ is greater than $T_2$. In some embodiments, $T_2$ is greater than $T_1$.

A machine that may process device wafers may be configured to tolerate a range of warp of a wafer stack. In some embodiments, an engineered carrier wafer may be pre-stressed to keep the warp of the wafer stack within a desired warp range. In some embodiments, the engineered carrier wafer may not precisely counteract the warp of the device wafer but may keep the warp of the wafer stack within the tolerance range of all machines that may process a device wafer.

FIG. 7 illustrates example wafer stacks according to an embodiment of the disclosure. A device wafer 700 may have an initial warp before being coupled to an engineered carrier wafer. For example, the device wafer 700 may have a warp of 395 µm. This may be above a tolerance range of a machine. For example, the tolerance may be a warpage of +/−300 µm. The device wafer 700 may be coupled to an engineered carrier wafer to form wafer stack 705. The engineered carrier wafer may have been processed by a find grind on a face surface to induce a stress in the engineered carrier wafer. The wafer stack 705 may have a warp less than the warp of the device wafer 700 alone. For example, the wafer stack 705 may have a warp of 236 µm. Alternatively, the device wafer 700 may be coupled to an engineered carrier wafer pre-stressed by depositing a tetraethyl orthosilicate (TEOS) layer to form wafer stack 710. The wafer stack 710 may also have a warp less than the warp of the device wafer 700 alone. For example, the wafer stack 710 may have a warp of 235 µm.

A device wafer coupled to an engineered carrier wafer may not always reduce the warp of the wafer stack. For example, still referring to FIG. 7, device wafer 700 may be coupled to an engineered carrier wafer pre-stressed by an ultra-fine grinding process on a surface to form wafer stack 715. The warp of the wafer stack 715 may be greater than the warp of the device wafer 700, for example, 466 µm. In this example, the engineered carrier wafer fails to compensate for the warp of the device wafer 700 to keep the wafer stack within the tolerance of the machine. However, in some embodiments, the warp of the engineered carrier wafer may be corrected by processing the engineered carrier wafer after the device wafer has been coupled. For example, a layer may be deposited on a surface of the engineered carrier wafer opposite the device wafer to reduce the warp of the wafer stack. The ability to correct the warp of the engineered carrier wafer after coupling to the device wafer may be desirable when a device wafer exhibits an unexpected warp or the warp of a device wafer due to a process is unknown ahead of time. In some embodiments, the warp of the wafer stack may intentionally be increased. For example, a wafer stack may include an engineered carrier wafer that has a temperature dependent warp. The warp of the wafer stack may temporarily be outside the tolerance range of a machine. The machine may operate at an elevated temperature, and after the wafer stack is exposed to the elevated temperature, the engineered carrier wafer compensates for the device wafer warp, and the overall warp of the wafer stack may decrease to within the warp tolerance of the machine.

In some embodiments, the warp induced in a device wafer by each manufacturing step may be known. In some embodiments, the pre-stress required to apply to an engineered carrier wafer to induce a desired warp may also be known. In some embodiments, the pre-stress applied to an engineered carrier wafer by a process may be modeled by engineering software.

In some embodiments, the warping of the engineered carrier wafer may not be seen visually, even after the engineered carrier wafer has been pre-stressed. In some embodiments, the material of the engineered carrier wafer may be chosen such that the stress applied by the engineered carrier wafer on the device wafer counteracts, at least in part, a warp of the device wafer, even when the engineered carrier wafer alone does not exhibit a visually detectable warp.

In some embodiments, the engineered carrier wafers may be reusable. After being removed from a first device wafer, it may be coupled to a second device wafer to be processed. In some embodiments, the engineered carrier wafers may be disposable. A new engineered carrier wafer may be fabricated for each device wafer produced.

The use of engineered carrier wafers may reduce the warp of a wafer stack that includes the engineered carrier wafer and a device wafer. The reduction in warp may improve the quality of processing the device wafer. For example, polishing may produce a more even polish across the entire surface of the device wafer. The improved quality may be due, at least in part, by a more even surface of the device wafer provided to a machine for processing. The reduction in warp of the wafer stack may also reduce the incidence of false defect detection. For example, a camera may be used to image a surface of the device wafer. If the wafer stack exhibits a high magnitude of warp, portions of the surface may be outside the focal plane of the camera. This may result in areas of the image being out of focus. During processing, the out-of-focus areas of the image of the device wafer may be incorrectly labeled as defective. This may cause the rejection of a non-defective device wafer. Engineered carrier wafers may reduce damage to device wafers. For example, reduction in warp of the wafer stack may prevent the device wafer from cracking or permanently deforming due to the intrinsic stress applied to the device wafer. Other benefits of utilizing engineered carrier wafers to counteract the warp of device wafers may also be possible.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
performing a plurality of processes on a device wafer, wherein the device wafer is mounted to an engineered carrier wafer, and wherein the engineered carrier wafer at least comprises a first surface and a second surface opposite the first surface, and wherein the engineered carrier wafer is pre-stressed to exhibit a warp; and
performing a plurality of pre-stress processes on the engineered carrier wafer, wherein each of the plurality of pre-stress processes occurs prior to a subsequent process of the plurality of processes performed on the device wafer, and wherein each of the pre-stress processes are configured to further pre-stress the carrier wafer to exhibit further warp based on a stress the subsequent process of the plurality of processes will induce in the wafer.

2. The method of claim 1, further comprising depositing a layer on at least one of the first surface and second surface to pre-stress the engineered carrier wafer.

3. The method of claim 2, wherein the layer includes a metal.

4. The method claim 2, wherein the layer is a passivation layer.

5. The method of claim 1, wherein the warp is dependent on temperature.

6. The method of claim 1, further comprising polishing least one of the first surface and second surface to pre-stress the engineered carrier wafer.

7. The method of claim 1, further comprising forming an adhesive on the first surface of the engineered carrier wafer.

8. The method of claim 7, wherein the adhesive pre-stresses the engineered carrier wafer.

9. The method of claim 1, wherein the warp of the engineered carrier wafer is configured to reduce a warp of a wafer stack, wherein the wafer stack includes the engineered carrier wafer and the device wafer.

10. A method, comprising:
forming an engineered carrier wafer by performing a first process on a carrier wafer to pre-stress the carrier wafer;
coupling a device wafer to the engineered carrier wafer;
performing a second process on the device wafer;
performing a third process on the engineered carrier wafer, wherein the third process pre-stresses the engineered carrier wafer such that it induces a warp in the engineered carrier wafer configured to at least in part counteract a warp to be induced in the device wafer due to a fourth process, and
performing the fourth process on the device wafer.

11. The method of claim 10, wherein the device wafer is coupled to the carrier water before performing the first process.

12. The method of claim 10, wherein the first process pre-stresses the carrier wafer such that it induces a warp in the carrier wafer configured to counteract, at least in part, a warp in the device wafer.

13. The method of claim 10, wherein the first process is a layer deposition process.

14. The method of claim 10, wherein the first process is a doping process.

15. The method of claim 10, wherein the first process is an ion implantation process.

16. The method of claim 10, wherein the first process includes a plurality of processes.

17. The method of claim 10, wherein the first process is performed on at least one of a first surface or a second surface opposite the first surface of the carrier water.

18. The method of claim 10, further comprising performing a fifth process on the engineered carrier wafer and performing a sixth process on the device wafer.

19. The method of claim 18, wherein the fifth process pre-stresses the engineered carrier wafer such that it induces a warp in the engineered carrier wafer configured to counteract, at least in part, a warp in the device wafer, wherein the warp in the device wafer is induced by the sixth process.

20. A method, comprising:
pre-stressing an engineered carrier wafer to induce a first desired warp;
forming an adhesive layer on a surface of the engineered carrier wafer;
mounting a device wafer on the engineered carrier wafer by the adhesive layer to form a wafer stack;
forming a wafer stack comprising a wafer and the engineered carrier wafer;
performing a first pre-stress process on the wafer stack to induce a second desired warp in the engineered carrier wafer, wherein the second desired warp is based on and counteractive to a warp to be induced in the device wafer due to a first device wafer process;
performing the first wafer process; and
performing a second pre-stress process on the wafer stack to induce a third desired warp in the engineered carrier wafer, wherein the third desired warp is based on and counteractive to a warp to be induced in the device wafer due to a second wafer process,
wherein the first and second warps in the engineered carrier wafer are different.

21. The method of claim 20, further comprising selecting the first desired warp based on a warp the device wafer will incur due to mounting the device wafer on the engineered carrier wafer.

22. The method of claim 20, wherein performing the first and second pre-stress process on the wafer stack is performed to counteract, at least in part, a warp of the device wafer to reduce a warp of the wafer stack.

23. The method of claim 20, wherein the engineered carrier wafer includes at least one of silicon, quartz, sapphire, and silicon carbide.

24. The method of claim 20, wherein the desired warp is not substantially detectable in the engineered carrier wafer.

* * * * *